(12) United States Patent
Erell

(10) Patent No.: US 7,630,887 B2
(45) Date of Patent: Dec. 8, 2009

(54) ENHANCING THE INTELLIGIBILITY OF RECEIVED SPEECH IN A NOISY ENVIRONMENT

(75) Inventor: Adoram Erell, Herzliyya (IL)

(73) Assignee: Marvell World Trade Ltd., Hamilton (BM)

(*) Notice: Subject to any disclaimer, the term of this patent is extended or adjusted under 35 U.S.C. 154(b) by 85 days.

(21) Appl. No.: 11/498,458

(22) Filed: Aug. 2, 2006

(65) Prior Publication Data

US 2006/0271358 A1 Nov. 30, 2006

Related U.S. Application Data

(63) Continuation of application No. 10/062,181, filed on Jan. 30, 2002, now Pat. No. 7,089,181, which is a continuation-in-part of application No. 09/867,028, filed on May 30, 2001, now Pat. No. 6,959,275.

(60) Provisional application No. 60/207,273, filed on May 30, 2000.

(51) Int. Cl.
   *G10L 19/14* (2006.01)

(52) U.S. Cl. .................................... 704/225

(58) Field of Classification Search .......... 704/224–226
   See application file for complete search history.

(56) References Cited

U.S. PATENT DOCUMENTS

| | | | |
|---|---|---|---|
| 4,609,788 A | 9/1986 | Miller et al. | |
| 4,611,342 A | 9/1986 | Miller et al. | |
| 4,628,529 A | 12/1986 | Borth et al. | |
| 5,012,519 A * | 4/1991 | Adlersberg et al. ......... | 704/226 |
| 5,303,308 A | 4/1994 | Larsen et al. | |
| 5,778,338 A * | 7/1998 | Jacobs et al. ............... | 704/223 |
| 5,890,109 A | 3/1999 | Walker et al. | |
| 5,903,819 A | 5/1999 | Romesburg | |
| 5,907,823 A | 5/1999 | Sjöberg et al. | |
| 5,978,756 A | 11/1999 | Walker et al. | |
| 6,073,848 A * | 6/2000 | Giebel ................... | 235/462.26 |
| 6,212,273 B1 | 4/2001 | Hemkumar et al. | |
| 6,262,943 B1 | 7/2001 | Clarke | |
| 6,535,846 B1 | 3/2003 | Shashoua | |
| 6,674,865 B1 * | 1/2004 | Venkatesh et al. ........... | 381/107 |
| 6,708,146 B1 | 3/2004 | Sewall et al. | |
| 6,754,337 B2 | 6/2004 | Domer et al. | |
| 6,820,054 B2 | 11/2004 | Erell et al. | |
| 6,959,275 B2 | 10/2005 | Erell | |

(Continued)

FOREIGN PATENT DOCUMENTS

DE   EP00600164 A1 *   6/1994

(Continued)

OTHER PUBLICATIONS

Int'l Search Report for PCT/US02/015776, dated Jul. 17, 2003.

(Continued)

*Primary Examiner*—Michael N Opsasnick

(57) ABSTRACT

A device receives a signal that includes human-interpretable audio information. The device automatically adjusts the volume of the audio information at the received end. The volume control is determined by an automatic volume control gain, which is calculated as a function of the automatic gain control gain, a weighted dynamic range compression gain, and a weighted constant gain.

28 Claims, 3 Drawing Sheets

U.S. PATENT DOCUMENTS

| | | |
|---|---|---|
| 7,089,181 B2 | 8/2006 | Erell |
| 2001/0012997 A1 | 8/2001 | Erell |
| 2002/0019733 A1 | 2/2002 | Erell |
| 2002/0077813 A1 | 6/2002 | Erell |
| 2003/0002659 A1 | 1/2003 | Erell |
| 2003/0004712 A1 | 1/2003 | Erell |
| 2003/0023433 A1 | 1/2003 | Erell et al. |
| 2005/0027526 A1 | 2/2005 | Erell et al. |

FOREIGN PATENT DOCUMENTS

| | | |
|---|---|---|
| DE | 94 21 650 | 7/1996 |
| DE | 94 21 650 U1 | 7/1996 |
| EP | 0 600 164 | 6/1994 |
| EP | 0 600 164 A1 | 6/1994 |
| EP | 0 763 888 | 3/1997 |
| EP | 0 763 888 A2 | 3/1997 |
| WO | WO 00/60830 | 10/2000 |

OTHER PUBLICATIONS

Int'l Search Report for PCT/US02/014015, dated Aug. 1, 2002.

English-Language Abstract for DE 94 21 650 U1.

A.T. Schneider et al., "An Adaptive Dynamic Range Controller for Digital Audio," IEEE Pacific Rim Conf. on Communications, Computers and Signal Processing, pp. 339-342, May 9-10, 1991.

Schneider, A., et al., "An adaptive dynamic range controller for digital audio", *IEEE/Communications, Computers and Signal Processing*, pp. 339-342, May 1991 (XP010039446).

* cited by examiner

ENHANCING THE INTELLIGIBILITY OF RECEIVED SPEECH IN A NOISY ENVIRONMENT

CROSS-REFERENCE TO RELATED APPLICATIONS

This application is a continuation application of and claims priority to U.S. application Ser. No. 10/062,181, filed Jan. 30, 2002, which is a continuation-in-part of U.S. application Ser. No. 09/867,028, filed May 30, 2001, now U.S. Pat. No. 6,959,275, which claims the benefit of U.S. provisional application Ser. No. 60/207,273, filed May 30, 2000.

TECHNICAL FIELD

This invention relates to audio signal processing for speech communication.

BACKGROUND

The increasing demand for constant personal communication has resulted in the availability of phones in just about any location imaginable. Wireless or mobile phones have enabled individuals to communicate while roaming in a variety of dynamic environments, such as airplanes, cars, restaurants, and other public and private places. Furthermore, wireline phones, such as public pay phones, can be found in a variety of different environments, such as airports, train stations, stores, and gas stations, among others. These and other such environments are associated with considerable ambient or background noise which makes it difficult to clearly transmit and receive intelligible speech at an audible level.

As a result, the individuals on a phone conversation may often have to repeat themselves, which is inconvenient, time-consuming, inefficient and costly. Alternatively, they may shout or raise their voices to be heard over the noise, which compromises the privacy of the conversation. A person in a noisy environment may also increase the volume of the phone in order to better hear the person who is speaking on the other end.

Manually adjusting the volume level in response to loud background noise is tedious for both the individual at the speaking end and the individual at the listening end. Furthermore, manually increasing volume in response to background noise is undesirable since the volume must be later manually decreased to avoid acutely loud reception when the background noise dies down.

DESCRIPTION OF DRAWINGS

Like reference symbols in the various drawings indicate like elements.

DETAILED DESCRIPTION

Figure 1:
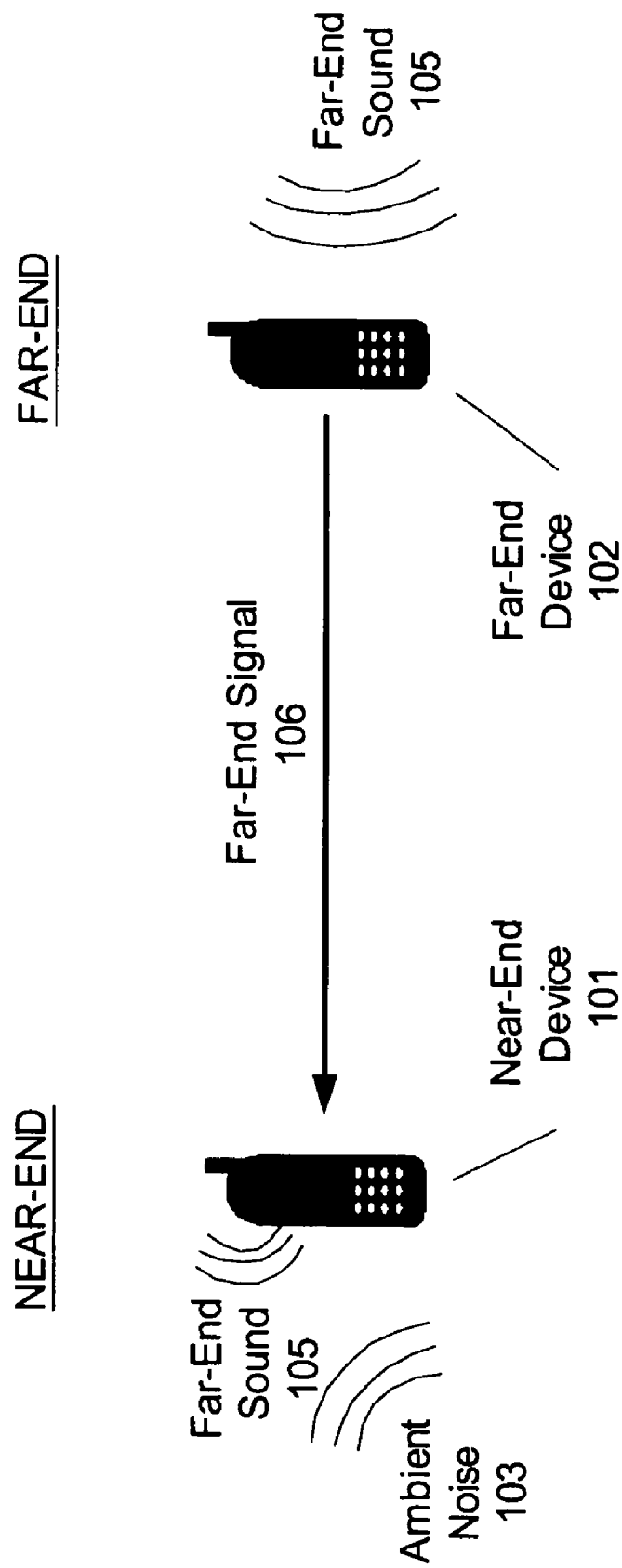
FIG. 1 illustrates a communication system used for transmitting an audio signal from a far-end to a near-end.

Referring to the example in FIG. 1, a far-end device 102 detects far-end sound 105 that can include speech. The sound 105 is converted to a signal 106, the far-end signal, which is transmitted to the near-end device 101, for example, by modulating a radio frequency signal, interfacing with a network such as the Internet, or sending a signal on a waveguide. The transmission of the signal 106 can also include combinations of known signal transmission modes, such as those that use electric, optical, microwave, infrared, and radio signals, and any number of intermediaries, such as switches, computer servers, and satellites.

The near-end device 101 reproduces the far-end sound 105. The near-end device 101 also detects near-end sound that can include ambient noise 103. The near-end device 101 processes the signal 106 in response to the ambient noise 103 in order to render the far-end sound 105 more human-interpretable to a user of the near-end device 101.

In the example depicted in FIG. 1, the near-end device 101 is a handheld telephone that receives the far-end signal 106 from the far-end device 102 which is a telephone at a remote location.

Figure 2:
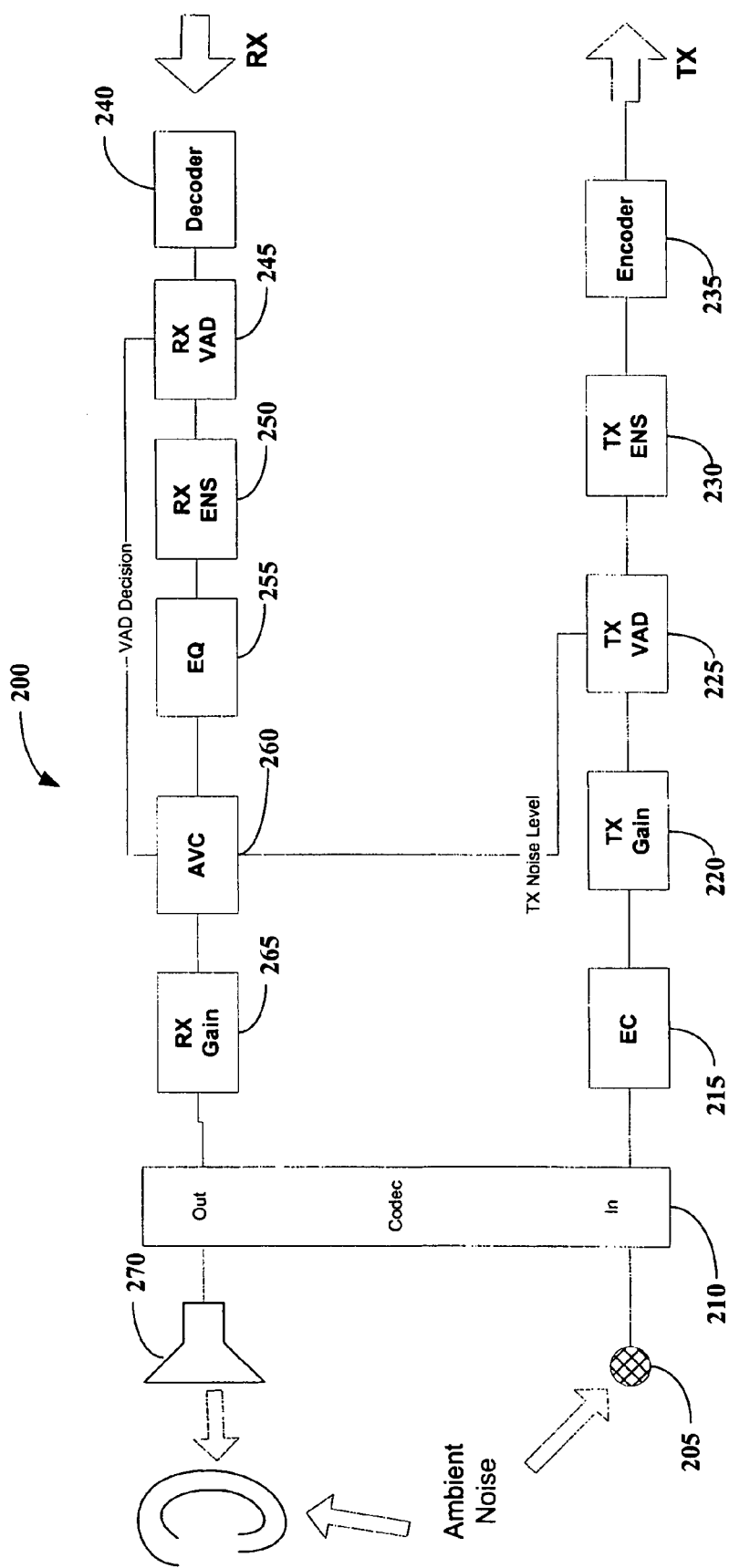
FIG. 2 illustrates an audio path using a receive side automatic volume control according to one embodiment of the present invention.

An audio path using automatic volume control (AVC) is illustrated in FIG. 2 in the audio path, the near-end device 101 uses a microphone 205 to detect sound and ambient noise on the near-end. An analog signal for the near-end sound can be converted into a digital signal by a processor, CODEC 210. The digital signal is then sent through an echo canceller 215 to remove any echo from the signal. The signal is then processed by a transmission side gain control 220 to determine if any gain is needed by the signal. The resulting signal is evaluated by a transmit voice activity detector (VAD) 225, then sent through a noise suppressor 230 prior to being encoded by an encoder 235 for transmission (TX). The transmission VAD 225 supplies a signal to a receive signal automatic volume control (RX-AVC) module 260 indicating the noise level at the transmission end.

The receive path receives the transmitted signal and decodes the received signal in the decoder 240. The decoded signal is then evaluated by the receive VAD 245 and processed by the receive enhanced noise suppressor 250 and an equalizer 255. The RX-AVC module 260 then automatically controls the received speech level and dynamic range. The AVC module 260 is a collection of three functions. The functions include an automatic gain control (AGC), an automatic volume increase and dynamic range compression (DRC) as a function of the transmit noise level, and a DRC for the speakerphone. After being processed by the AVC module 260, the signal is processed by a receive gain controller 265, and then converted to an analog signal by the CODEC 210. The analog signal is then rendered as sound by a speaker 270.

Figure 3:
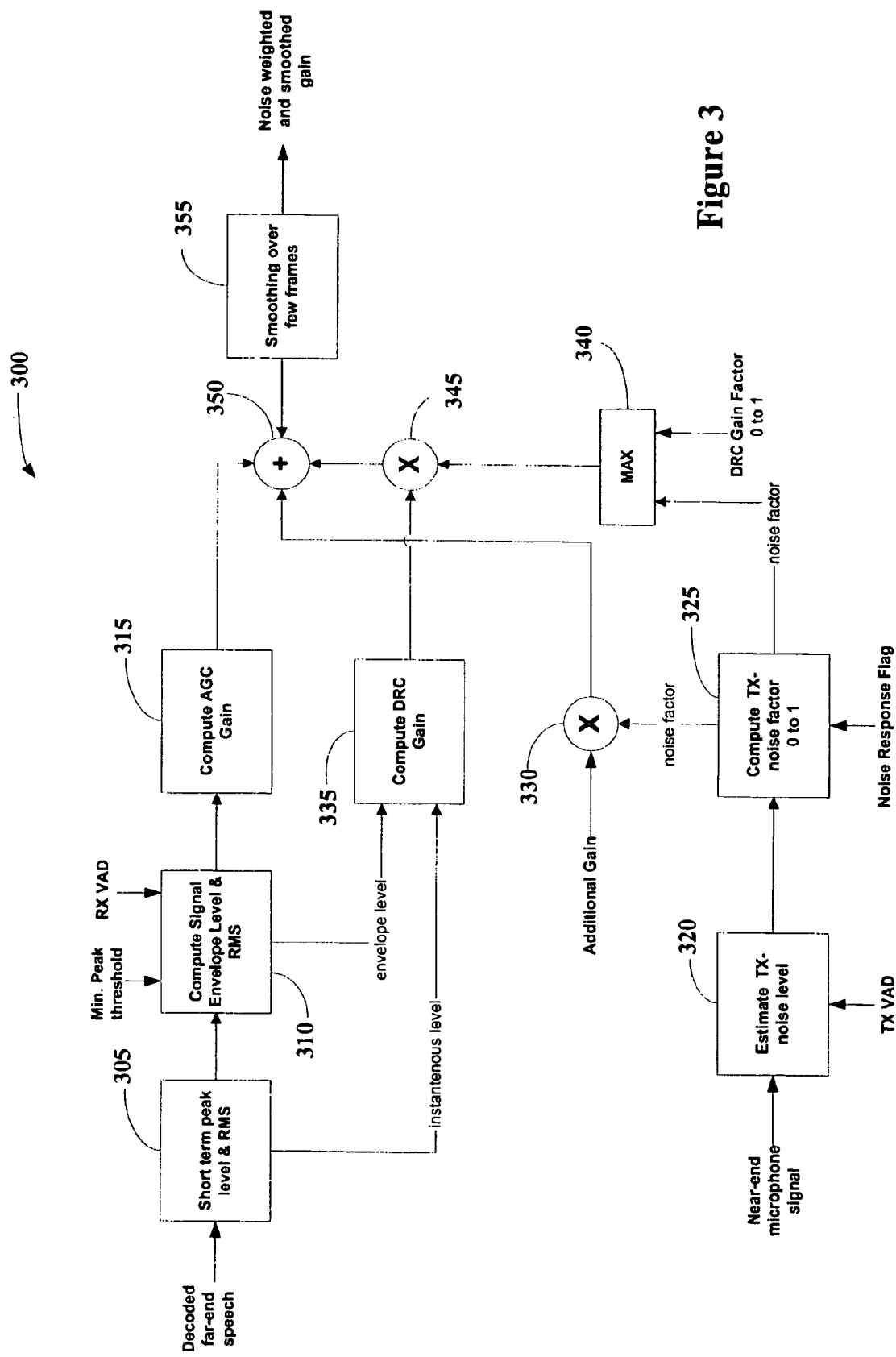
FIG. 3 illustrates a process for determining the automatic volume control gain according to one embodiment of the present invention.

The total gain of the AVC module 260 is determined by summing three gains: the AGC, the DRC gain weighted by a maximum between a weight proportional to the transmit noise level and the DRC gain factor, and an additional gain whose value is weighted by the transmit noise level. FIG. 3 illustrates a process for determining the total gain of the AVC module 260 according to one embodiment of the present invention.

FIG. 3 illustrates a process 300 to determine the total AVC gain according to one embodiment of the present invention. The total AVC gain is the sum of three gains, the AGC gain, an additional constant gain weighted by the transmission noise level, and a weighted DRC gain. The process 300 begins in block 305 where the maximum sample energy of the decoded far-end speech over a sub frame is computed. The sub frame may consist of several samples, and may have a default number of samples such as 16. The number of samples in the sub frame represents a compromise between a desired fine time resolution for the gain update decisions (smaller sub frame)

versus computation resources (larger sub frame). In block 305, the process 300 also computes the RMS energy level over the sub frame.

Proceeding to block 310, the process 300 computes the signal envelope level and speech RMS. The minimum peak threshold and the RX-VAD detected speech are received as inputs to the computation of the signal envelope level. The envelope is then updated if the RX-VAD detected speech and the local peak threshold are above a predetermined threshold level. The threshold level may also be dynamic. The pseudo code for updating the envelope is as follows:

```
if (RX-VAD && local_peak > MIN_ENVELOPE)
{
  if (local_peak > envelope)
    envelope = min(local_peak, envelope + INCREMENT_PEAK);
  else
    envelope -= DECREMENT_PEAK'
  if (rms>long_term_rms)
    long_term_rms +=INCREMENT_RMS;
  else
    long_term_rms -=INCREMENT_RMS;
}
```

MIN_ENVELOPE is provided to ensure that signals whose envelopes are smaller than this threshold do not affect the AGC.

Proceeding to block 315, the process 300 computes the AGC gain. The basic relation for the AGC gain is defined as agc_gain=(LEVEL1—envelope). LEVEL1 is the target level for the receive signal envelope level. The default value is 3 dB below the clipping level. The basic relation includes two limitations. The first limitation is that the agc_gain=min (MAX_AGC_GAIN, agc_gain), or that the AGC gain cannot exceed a maximum value. MAX_AGC_GAIN is the upper limit on the AGC gain, with a default value of 21 dB. The second limitation is agc_gain=min(MAX_RMS—long_term_rms, agc_gain), or that the AGC gain is the lesser of the calculated AGC gain and the maximum RMS minus the long term RMS. MAX_RMS is provided so the AGC gain is limited to the signal RMS after amplification, with a default of −15 dB below clipping. The AGC gain is then included as one input to the summer 350.

Proceeding to block 335, the process 300 computes the DRC gain. The instantaneous level and the envelope level are received as inputs to the computation of the DRC gain. The DRC gain computation is given the noise dependent and receive signal independent parameters:

drc_gain=MAX_DRC_GAIN * max(drc_gain_factor, noise factor). The MAX_DRC_GAIN is the upper limit on the DRC gain. A default value may be set to the maximum allowable 21 dB. Decreasing this parameter decreases the effect of the DRC. The drc_gain_factor controls the amount of DRC.

For each sub-frame, the DRC gain of the frame is calculated as a function of the local peak and the envelope level. The resulting raw DRC gain is supplied to the multiplier 345.

Proceeding to block 320, the near-end microphone signal is received and the transmission noise level is estimated. An input from the TX VAD is used to estimate the transmission noise level.

Proceeding to block 325, the transmission noise level is used to compute a transmission noise factor, which in one embodiment may be a number between 0 and 1. The noise factor is a function of the noise level. For example, with no ambient transmission noise, the transmission noise factor will be 0. As the transmission noise increases, the noise factor increases until a maximum transmission noise level is reached. At the maximum transmission noise level, the noise factor is 1. The noise factor is provided as an input to the multiplier 330 and the MAX block 340.

Proceeding to multiplier 330, a constant additional gain is multiplied by the noise factor to obtain an additional constant gain whose value is weighted by the transmission noise level. The weighted constant gain is then provided as a second input to the adder 350.

Proceeding to block 340, a maximum is determined between the noise factor and the DRC Gain Factor. The larger of the two factors is then supplied to the multiplier 345 to weight the computed DRC gain. The resultant weighted DRC gain is then supplied as a third input to the adder 350.

The adder 350 combines the AGC gain, the weighted DRC gain, and the weighted additional constant gain to determine the total AVC gain. The total AVC gain may then be smoothed over a few frames using signed exponential smoothing using the following pseudo code:

```
if (target_gain > smooth_gain_db)
  alfa = ALFA_UP;
else
  alfa = ALFA_DOWN;
smooth_gain_db = smooth_gain_db * (1-alfa) + alfa * target_gain;
```

The result is a noise weighted and smoothed total AVC gain.

The techniques may be implemented in hardware, software, or a combination of the two in order to analyze digital or analog signals. The techniques described here are also not limited to telephones, or the exemplary configuration described above; they may find applicability in any computing or processing environment for communications. For example, desktop computers linked to a computer network can be used to exchange sound communications that include human speech and ambient noise. Typically, each device may include a sound input device, such as a microphone, and a sound output device, such as a loudspeaker.

A number of embodiments of the invention have been described. Nevertheless, it will be understood that various modifications may be made without departing from the spirit and scope of the invention. Accordingly, other embodiments are within the scope of the following claims.

What is claimed is:

1. A method comprising:
    computing at a local device a short term signal level for a frame of an audio signal, wherein the audio signal is transmitted from a remote device and received by the local device;
    computing at the local device a long term signal level based on the short term signal level for the frame and multiple previous short term signal levels computed for multiple previous frames of the audio signal;
    computing at the local device an automatic gain control (AGC) gain for the frame based on the long term signal level;
    computing at the local device a dynamic range compression (DRC) gain;
    computing at the local device a noise factor indicative of a level of ambient noise at the local device; and
    adjusting at the local device an amplitude of the audio signal based on the AGC gain, the DRC gain, and the noise factor.

2. A method according to claim 1, wherein computing the AGC gain comprises determining a difference between the long term signal level and a target level.

3. A method according to claim 1, further comprising computing a corresponding AGC gain for each frame of a plurality of frames based on a corresponding short term signal level for the frame.

4. A method according to claim 1, wherein the DRC gain is computed based on the short term signal level and the long term signal level.

5. A method according to claim 4, wherein computing the DRC gain comprises computing the DRC gain for the frame.

6. A method according to claim 5, further comprising computing a corresponding DRC gain for each frame of a plurality of frames based on a corresponding short term signal level for the frame.

7. A method according to claim 1, wherein adjusting the amplitude comprises computing a total gain based on the AGC gain, the DRC gain, and the noise factor.

8. A method according to claim 7, further comprising smoothing the total gain.

9. A method according to claim 1, wherein adjusting the amplitude comprises weighing the DRC gain by the noise factor.

10. A method according to claim 9, wherein adjusting the amplitude comprises weighing the DRC gain by the greater of the noise factor and a DRC gain factor.

11. A method according to claim 1, wherein adjusting the amplitude comprises:
weighing an additional gain by the noise factor; and
adjusting the amplitude of the audio signal based on the AGC gain, the DRC gain, and the weighted additional gain.

12. A method according to claim 11, wherein the additional gain is a constant.

13. A method according to claim 11, wherein adjusting the amplitude comprises computing a total gain based on the AGC gain, the DRC gain, and the weighted additional gain.

14. An apparatus comprising:
a processor configured to:
compute a short term signal level for a frame of a signal, wherein the signal is transmitted from a remote device and received by the apparatus;
compute a long term signal level based on the short term signal level for the frame and multiple previous short term signal levels computed for multiple previous frames of the signal;
compute an automatic gain control (AGC) gain for the frame based on the long term signal level;
compute a dynamic range compression (DRC) gain; and
adjust an amplitude of the signal based on the AGC gain, the DRC gain, and a noise factor indicative of a level of ambient noise proximate to the apparatus.

15. An apparatus according to claim 14, wherein the processor is further configured to compute the noise factor based on a signal received from a microphone.

16. An apparatus according to claim 14, wherein the processor is configured to:
determine a difference between the long term signal level and a target level; and
compute the AGC gain based on the difference between the long term signal level and a target level.

17. An apparatus according to claim 14, wherein the processor is configured to compute respective AGC gains for a plurality of frames based on respective short term signal levels for the respective frames.

18. An apparatus according to claim 14, wherein the processor is configured to compute the DRC gain based on the short term signal level and the long term signal level.

19. An apparatus according to claim 18, the processor is configured to compute the DRC gain for the frame.

20. An apparatus according to claim 19, wherein the processor is configured to compute respective DRC gains for a plurality of frames based on respective short term signal levels for the respective frames.

21. An apparatus according to claim 14, wherein the processor is configured to:
compute a total gain based on the AGC gain, the DRC gain, and the noise factor; and
adjust the amplitude of the signal based on the total gain.

22. An apparatus according to claim 21, wherein the processor is configured to:
smooth the total gain; and
adjust the amplitude of the signal based on the smoothed total gain.

23. An apparatus according to claim 22, wherein the processor is configured to weigh the DRC gain by the noise factor.

24. An apparatus according to claim 23, wherein the processor is configured to weigh the DRC gain by the greater of the noise factor and a DRC gain factor.

25. An apparatus according to claim 14, wherein the processor is configured to:
weigh an additional gain by the noise factor; and
adjust the amplitude of the signal based on the AGC gain, the DRC gain, and the weighted additional gain.

26. An apparatus according to claim 25, wherein the additional gain is a constant.

27. An apparatus according to claim 25, wherein the processor is configured to:
compute a total gain based on the AGC gain, the DRC gain, and the additional gain; and
adjust the amplitude of the signal based on the total gain.

28. A computer readable medium having computer readable instructions stored thereon that when executed by a processor of a communication device cause the processor to:
compute a short term signal level for a frame of a signal, wherein the signal is transmitted from a remote device and received by the communication device;
compute a long term signal level based on the short term signal level for the frame and multiple previous short term signal levels computed for multiple previous frames of the signal;
compute an automatic gain control (AGC) gain for the frame based on the long term signal level;
compute a dynamic range compression (DRC) gain; and
adjust an amplitude of the signal based on the AGC gain, the DRC gain, and a noise factor indicative of a level of ambient noise proximate to the communication device.

* * * * *